US011579362B2

(12) United States Patent
Chen et al.

(10) Patent No.: US 11,579,362 B2
(45) Date of Patent: Feb. 14, 2023

(54) CAVITY SUBSTRATE HAVING DIRECTIONAL OPTOELECTRONIC TRANSMISSION CHANNEL AND MANUFACTURING METHOD THEREOF

(71) Applicant: Zhuhai ACCESS Semiconductor Co., Ltd, Guangdong (CN)

(72) Inventors: Xianming Chen, Guangdong (CN); Lei Feng, Guangdong (CN); Benxia Huang, Guangdong (CN); Wenshi Wang, Guangdong (CN); Lina Jiang, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 0 days.

(21) Appl. No.: 17/463,815

(22) Filed: Sep. 1, 2021

(65) Prior Publication Data
US 2022/0066096 A1 Mar. 3, 2022

(30) Foreign Application Priority Data
Sep. 2, 2020 (CN) .......................... 202010912209.0

(51) Int. Cl.
*G02B 6/122* (2006.01)
*G02B 6/132* (2006.01)
*G02B 6/136* (2006.01)
*G02B 6/12* (2006.01)

(52) U.S. Cl.
CPC ............. *G02B 6/122* (2013.01); *G02B 6/132* (2013.01); *G02B 6/136* (2013.01); *G02B 2006/121* (2013.01)

(58) Field of Classification Search
CPC ........ G02B 6/122; G02B 6/132; G02B 6/136; G02B 2006/121; G02B 6/4201; H01L 25/167; H01L 21/78; H01L 23/13; H01L 21/4846; H01L 23/49838
See application file for complete search history.

(56) References Cited

U.S. PATENT DOCUMENTS

2022/0045043 A1* 2/2022 Chen ...................... H01L 25/165
2022/0075112 A1* 3/2022 Cardile ..................... G02B 6/42

FOREIGN PATENT DOCUMENTS

CN 107422429 B 8/2019

* cited by examiner

Primary Examiner — John Bedtelyon
(74) Attorney, Agent, or Firm — The PL Law Group, PLLC

(57) ABSTRACT

A cavity substrate may have a directional optoelectronic transmission channel. The cavity substrate includes a support frame, a first dielectric layer on a first surface of the support frame, and a second dielectric layer on a second surface of the support frame. The support frame, the first dielectric layer and the second dielectric layer constitute a closed cavity having an opening on one side in the length direction of the substrate, a first circuit layer is arranged on the inner surface of the first dielectric layer facing the cavity, an electrode connected with an optical communication device is arranged on the first circuit layer, the electrode is electrically conducted with the first circuit layer, a second circuit layer is arranged on the outer surfaces of the first dielectric layer and the second dielectric layer, and the first circuit layer and the second circuit layer are communicated through a via column.

13 Claims, 10 Drawing Sheets

CAVITY SUBSTRATE HAVING DIRECTIONAL OPTOELECTRONIC TRANSMISSION CHANNEL AND MANUFACTURING METHOD THEREOF

CROSS-REFERENCE TO RELATED APPLICATION

This application claims the benefit under 35 USC § 119(a) of Chinese Patent Application No. 202010912209.0, filed on Sep. 2, 2020, in the China Intellectual Property Office, the entire disclosure of which is incorporated herein by reference for all purposes.

BACKGROUND

1. Technical Field

The invention relates to an electronic device packaging structure, in particular to a cavity substrate with a directional optoelectronic transmission channel and a manufacturing method thereof.

2. Background of the Invention

Optical fiber technology has become more and more popular, and optoelectronic modules have been widely used. The current optoelectronic module is mainly composed of a receiving optical subassembly, a transmitting optical subassembly, an optical interface, an internal circuit board, a heat conducting frame, a shell, and like portions. On the transmit side of the optoelectronic transceiver, a laser diode and associated circuits are used to generate a modulated optical signal (representing data) that is ultimately coupled into an output signal path (optical fiber, waveguide, etc.); the receiving optical subassembly is to assemble a light receiving device on the receiving side PCB. The light receiving device is generally integrated inside one metal tube shell by a photodetector (APD tube or PIN tube), preamplifier and thermistor, and like component parts. One or more input optical signals are converted from an optical signal to an electrical signal within a photodiode or similar apparatus. Because the electrical signal is very weak, amplification apparatuses (e.g., transimpedance amplifiers) are generally used to enhance signal strength before attempting to recover data information from the received signal.

As the demand for optical transceiver modules continues to increase, individual unit assembly methods become problematic such that there remains a need for different methods of optical transceiver assembly that can improve the efficiency of the construction process while maintaining the integrity of the module (including the precise optical alignment between the required components).

In order to complete the manufacturing of the optoelectronic transceiving integrated module structure, the traditional manufacturing process needs one-stage and one-stage assembly, the whole process is multiple in procedures, the production efficiency is low, the external force resistance of the assembled optoelectronic transceiving integrated module structure is poor, and the tightness of the assembled optoelectronic transceiving integrated module structure is not good enough, making it easy to suffer from water vapor erosion.

CN107422429B discloses a system-in-package structure integrating optoelectronic transceiving function and a manufacturing method thereof, wherein a sending module and a receiving module of an optoelectronic module and a control circuit of the optoelectronic module are integrated into one system-in-package through a special metal shell part and a system-in-package (SIP) process. However, the structure can only attach the optoelectronic device and the passive device on the surface of the substrate, the packaging area and the volume are large, and the requirement of miniaturization cannot be met; in addition, the light emitting device and the light receiving device need to be separated by a metal blocking wall in the packaging procedure so as to prevent the interference between signals, thereby increasing the manufacturing steps and increasing the packaging volume.

SUMMARY

The implementation of the present invention is directed to providing a cavity substrate having a directional optoelectronic transmission channel and a manufacturing method thereof, so as to solve the above-mentioned technical problem. According to the invention, a cavity for installing the optical communication device is arranged in the packaging substrate such that the problem of surface mounting of the optical communication device is solved, and the packaged volume can be remarkably reduced compared with the prior art; the positions of the light receiving device and the light emitting device are separated such that the interference of optical signal is avoided, and the noise point of a signal is reduced; no metal blocking wall needs to be added, process steps are reduced, and the manufacturing cost is reduced.

The first aspect of the present invention relates to a cavity substrate having a directional optoelectronic transmission channel, the cavity substrate comprising a support frame, a first dielectric layer located on the first surface of the support frame, and a second dielectric layer located on a second surface of the support frame. The support frame, the first dielectric layer and the second dielectric layer constitute a closed cavity having an opening on one side in a length direction of the substrate, a first circuit layer is arranged on an inner surface of the first dielectric layer facing the cavity, at least one electrode connected with an optical communication device is arranged on the first circuit layer, the electrode is electrically conducted with the first circuit layer, a second circuit layer is arranged on outer surfaces of the first dielectric layer and the second dielectric layer, and the first circuit layer and the second circuit layer are communicated through a via column.

In some embodiments, the optical communication device comprises a light emitting device or a light receiving device such that an open side of the cavity forms a directional optoelectronic transmission channel of the optical communication device.

In some embodiments, when the optical communication device is placed in the cavity, the electrode is connected with a terminal of the optical communication device, and an optical communication active surface of the optical communication device faces the open side of the cavity.

In some embodiments, the support frame comprises an insulating layer; preferably, the insulating layer comprises polyimide, epoxy resin, bismaleimide/triazine resin, polyphenyl ether, polyacrylate, prepreg, film-like organic resin, or a combination thereof.

In some embodiments, the first dielectric layer and the second dielectric layer comprise a thermosetting dielectric material; preferably, the first dielectric layer and the second dielectric layer comprise a thermosetting dielectric material containing glass fiber as the reinforcing material. The materials of the first dielectric layer and the second dielectric layer may be the same or different.

In another aspect of the present invention, there is provided a manufacturing method for a cavity substrate having a directional optoelectronic transmission channel, comprising the following steps:

(a) preparing a support frame, wherein the support frame comprises an insulating layer, a via column penetrating through the insulating layer in a thickness direction and a cavity surrounded by the insulating layer;

(b) applying an adhesive layer on a first surface of the support frame, and mounting an active metal block on the adhesive layer exposed in the cavity, wherein the active metal block comprises an electrode coated with etching-resistant metal at a bottom of the active metal block;

(c) laminating a second dielectric layer on a second surface of the support frame to fill a gap of the cavity;

(d) removing the adhesive layer;

(e) forming a first circuit layer on the first surface of the support frame, and connecting the electrode to the first circuit layer;

(f) laminating a first dielectric layer on the first circuit layer;

(g) forming a second circuit layer on outer surfaces of the first dielectric layer and the second dielectric layer;

(h) removing dielectric in the cavity to expose the active metal block;

(i) etching the active metal block and the etching-resistant metal coating the electrode; and (j) cutting along a scribe line of the support frame to obtain the cavity substrate having a directional optoelectronic transmission channel.

Preferably, the adhesive layer in step (b) comprises a tape.

Preferably, the active metal block in step (b) is a copper block or an aluminum block.

Preferably, the etching-resistant metal coated on the electrode is selected from at least one of nickel or titanium.

In some embodiments, the first dielectric layer and the second dielectric layer comprise a thermosetting dielectric material; preferably, the first dielectric layer and the second dielectric layer comprise a thermosetting dielectric material containing glass fiber as the reinforcing material.

In some implementations, step (e) comprises the following substeps:

(e1) sputtering a first metal seed layer on the first surface of the support frame;

(e2) applying an adhesive first photoresist layer on the surface of the first metal seed layer;

(e3) patterning the first photoresist layer to form a circuit pattern;

(e4) depositing copper in the circuit pattern to form the first circuit layer such that the electrode is connected with the first circuit layer;

(e5) applying a second photoresist layer on the first circuit layer;

(e6) patterning the second photoresist layer to form a first conductive hole;

(e7) depositing copper in the first conductive hole to form a first conductive column; and (e8) removing the first photoresist layer and the second photoresist layer, and etching away the first metal seed layer.

Preferably, the copper is deposited by electroplating.

In some embodiments, step (f) comprises laminating the first dielectric layer on the first circuit layer and the first conductive column, and thinning and flattening the first dielectric layer by means of nog plate or plasma etching to expose the end of the first conductive column.

In some implementations, step (g) comprises the following substeps:

forming a second conductive hole in the second dielectric layer;

sputtering a second metal seed layer on the first dielectric layer and the second dielectric layer;

electroplating copper on the second metal seed layer to form a copper layer;

applying a third photoresist layer on the copper layer;

patterning the third photoresist layer to form a circuit pattern;

etching the copper layer and the second metal seed layer to form the second circuit layer; and removing the third photoresist layer.

Preferably, a second conductive hole is formed in the second dielectric layer through laser trepanning.

Preferably, step (h) comprises opening the cavity by a laser process and removing the dielectric in the cavity to expose the active metal block.

Preferably, step (i) comprises introducing an etching liquid into the cavity through an opening opened by a laser to etch the active metal block and the etching-resistant metal coating the electrode.

Preferably, the scribe line comprises a centerline of the cavity such that a cavity opening is formed in a side edge of the substrate after cutting.

Preferably, after forming the cavity substrate unit, installing an optical communication device in the cavity and/or surface mounting the optical communication device on the second circuit layer may be comprised.

BRIEF DESCRIPTION OF THE DRAWINGS

For a better understanding of the invention and to show the implementation thereof, reference is now made, purely by way of example, to the accompanying drawings.

When referring to the accompanying drawings, it must be emphasized that the specific illustrations are exemplary and only for the purpose of demonstrative discussion of the preferred embodiments of the present invention, and are presented based on the provision that they are considered to be the most useful and understandable illustration of the description of the principles and concepts of the present invention. In this regard, no attempt is made to show structural details of the invention in more detail than is necessary for a fundamental understanding of the invention; the description with reference to the drawings will enable one skilled in the art to recognize how the several forms of the invention may be embodied in practice. In the drawings.

DETAILED DESCRIPTION OF THE EMBODIMENTS

Figure 1:
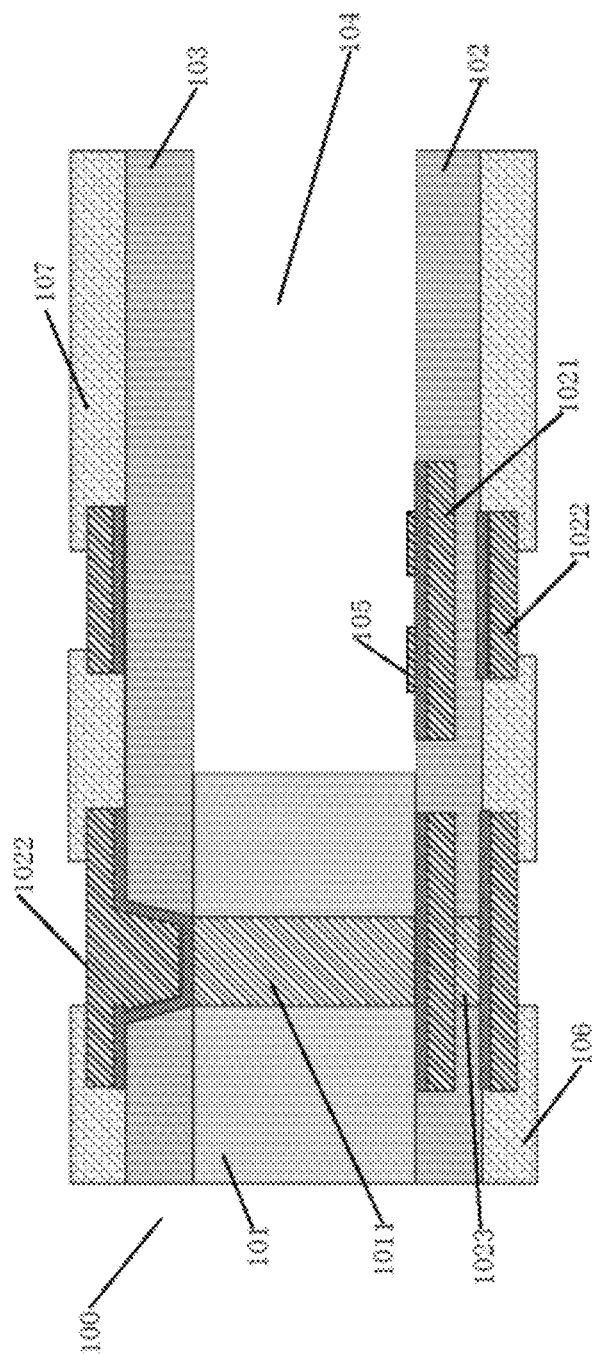
FIG. 1 is a schematic cross-sectional view of a cavity substrate having a directional optoelectronic transmission channel according to one embodiment of the present invention.

Referring to FIG. 1, there is shown a schematic cross-sectional view of a cavity substrate 100 having a directional optoelectronic transmission channel. The cavity substrate 100 includes a support frame 101, a first dielectric layer 102 on the lower surface of the support frame 101, and a second dielectric layer 103 on the upper surface of the support frame 101. The support frame 101 and the first dielectric layer 102 and the second dielectric layer 103 constitutes a closed cavity 104 with an opening on one side in the length direction of the substrate 100, a first circuit layer 1021 is arranged on the inner surface of the first dielectric layer 102 facing the cavity 104, at least one electrode 105 connected with an optical communication device is arranged on the first circuit layer 1021, and the electrode 105 and the first circuit layer 1021 are electrically conducted. A second circuit layer 1022 is arranged on the outer surfaces of the first dielectric layer 102 and the second dielectric layer 103, and the first circuit layer 1021 and the second circuit layer 1022 communicate through a via column 1011. A plurality of via columns 1011 may be arranged within the support frame 101 as TO channels, which may be the same or different in size. The via column 1011 is generally a copper via column.

The cavity 104 is substantially enclosed by the frame 101 and the first dielectric layer 102 and the second dielectric layer 103, but is open on one side in the length direction, i.e., the open side is on the side of the cavity substrate 100. An optical communication device may be arranged within the cavity 104 such that the open side of the cavity 104 forms a directional optoelectronic transmission channel for the optical communication device.

When the optical communication device is installed in the cavity 104, the electrode 105 arranged in the cavity 104 is connected with the terminal of the optical communication device, and the optical communication acting surface of the optical communication device faces the open side of the cavity 104. The optical communication device comprises a light emitting device or a light receiving device, and the mounting mode can be changed according to actual requirements. For example, the light receiving device may be placed within the cavity 104 and the light emitting device is mounted on the surface of the cavity substrate 100. Therefore, not only can the volume of the packaging body be remarkably reduced, but also the light receiving device and the light emitting device are thus separately arranged. The light paths of the light receiving device and the light emitting device are respectively in the length direction and the thickness direction of the substrate such that without adding a metal blocking wall the interference of an optical signal can be avoided, and the noise point of the signal, the process procedures, and the manufacturing cost can be reduced.

The support frame 101 includes an insulating layer and a metal via column extending through the insulating layer. Preferably, the insulating layer may comprise polyimide, epoxy, bismaleimide/triazine resin (BT), polyphenyl ether, polyacrylate, prepreg (PP), film-like organic resin (ABF), or a combination thereof, such as a combination of PP and ABF.

The first dielectric layer 102 and the second dielectric layer 103 may include a thermosetting dielectric material or a photosensitive resin material, preferably a thermosetting dielectric material containing glass fiber as a reinforcing material to secure the strength of the cavity substrate 100. The first dielectric layer 102 and the second dielectric layer 103 may comprise the same material or may comprise different materials.

As shown in FIG. 1, a first solder resist layer 106 and a second solder resist layer 107 may also be formed outside the first dielectric layer 102 and the second dielectric layer. A conductive column 1023 may also be formed in the first dielectric layer 102 to communicate the second circuit layer 1022 and the first circuit layer 1021.

Referring to FIGS. 2A-2I, there is shown a schematic cross-sectional view of intermediate structures of each step of the manufacturing method of the cavity substrate 100 having a directional optoelectronic transmission channel of FIG. 1.

Figure 2A:
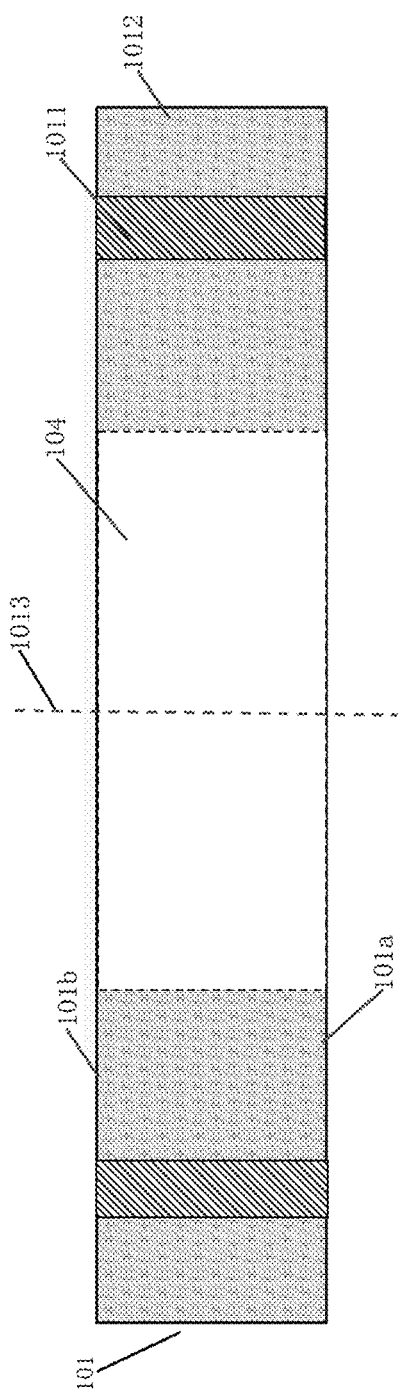
FIGS. 2A-2K show schematic cross-sectional views of intermediate structures at each step of the manufacturing method of the cavity substrate shown in FIG. 1.

The manufacturing method of the cavity substrate 100 with the directional optoelectronic transmission channel comprises the following steps: preparing a support frame 101-step (a), as shown in FIG. 2A. The support frame 101 includes an insulating layer 1012, a via column 1011 extending through the insulating layer, and a cavity 104 located in the insulating layer, with a cutting line 1013 arranged in the middle of the cavity 104.

In general, the manufacturing method of the support frame 101 includes the following substeps:

obtaining a sacrificial carrier;

applying a copper seed layer on the sacrificial carrier;

applying a corrosion-resistant layer on the copper seed layer;

applying another copper seed layer on the corrosion-resistant layer;

applying a photoresist layer;

the patterned photoresist layer having a copper via pattern;

plating copper into the pattern to form a via column 1011;

stripping the photoresist layer;

laminating an upstanding copper column (and optionally copper via) with a polymer dielectric to form an insulating layer 1012;

thinning and flattening to expose the end of the copper column (and the copper via);

applying a corrosion-resistant material;

removing the carrier and the copper column;

removing the blocking layer; and removing the etching protection layer to form the cavity 104.

Figure 2B:
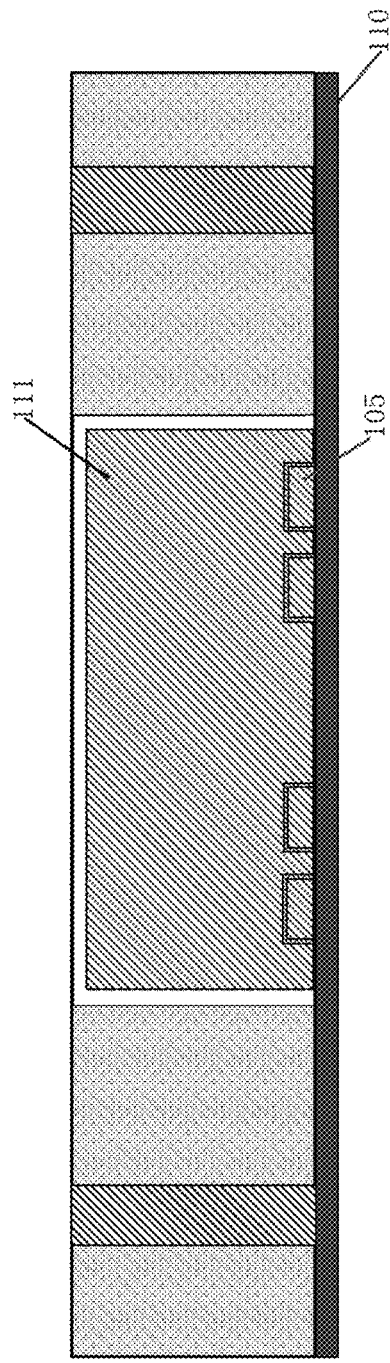

Next, an adhesive layer 110 is applied to the lower surface 101a of the support frame 101, and an active metal block 111 is mounted on the exposed adhesive layer 110-step (b), as shown in FIG. 2B. The bottom surface of the active metal block 111 is disposed with an electrode 105 coated with an etching-resistant metal. The adhesive layer may be a tape, generally a commercially available transparent film that is thermally decomposable or decomposable under ultraviolet radiation. The active metal block 111 is arranged within the cavity 104 and mounted on the exposed adhesive layer 110. The active metal block 111 is a metal that is very susceptible to corrosion by corrosive liquids, generally a copper block or an aluminum block. The electrode 105 is constituted of metallic copper, the surface of which is generally coated with an etching-resistant metal that is at least one of nickel or titanium. Generally, the etching-resistant metal needs to be removed with a specific corrosive liquid that is different from the corrosive liquid that etches the active metal block 111.

Figure 2C:
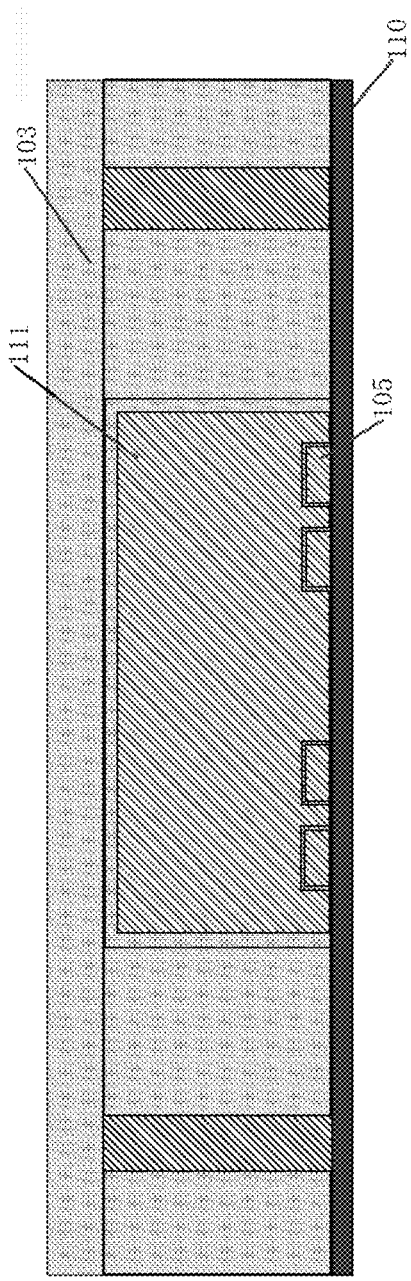

Then, the second dielectric layer 103 is laminated on the upper surface 101b of the support frame 101 such that the gap of the cavity 104 is filled with the dielectric-step (c), as shown in FIG. 2C. After the active metal block 111 is fixed, the second dielectric layer 103 is laminated on the upper surface 101b of the support frame 101 such that it fills the cavity 104 to further fix the active metal block 111. Generally, the second dielectric layer material is a thermosetting dielectric material, preferably a thermosetting dielectric material containing glass fiber as the reinforcing material, to form a strong second dielectric layer 103 to secure the strength of the cavity substrate 100.

Figure 2D:
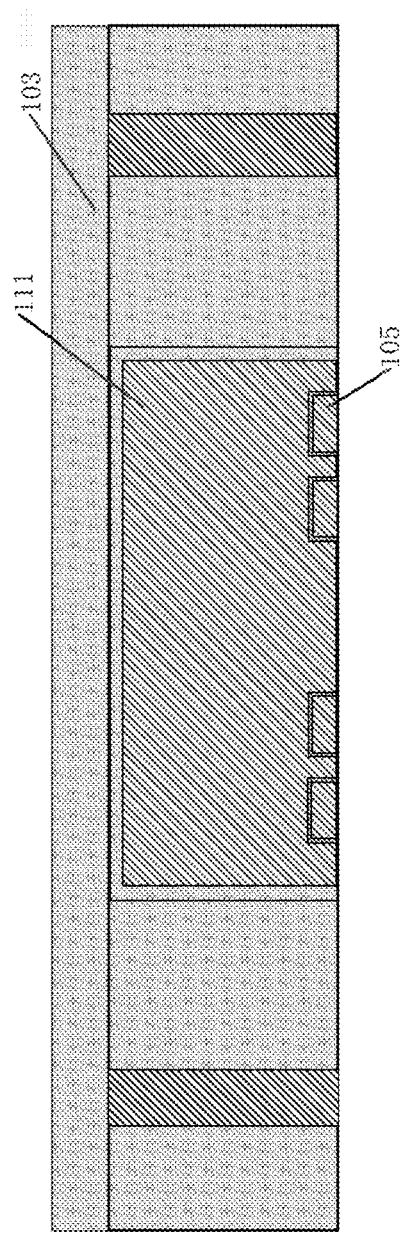

Next, the adhesive layer 110 is removed-step (d), as shown in FIG. 2D. The adhesive layer 110 may be removed by direct peeling or by heat or light.

Figure 2E:
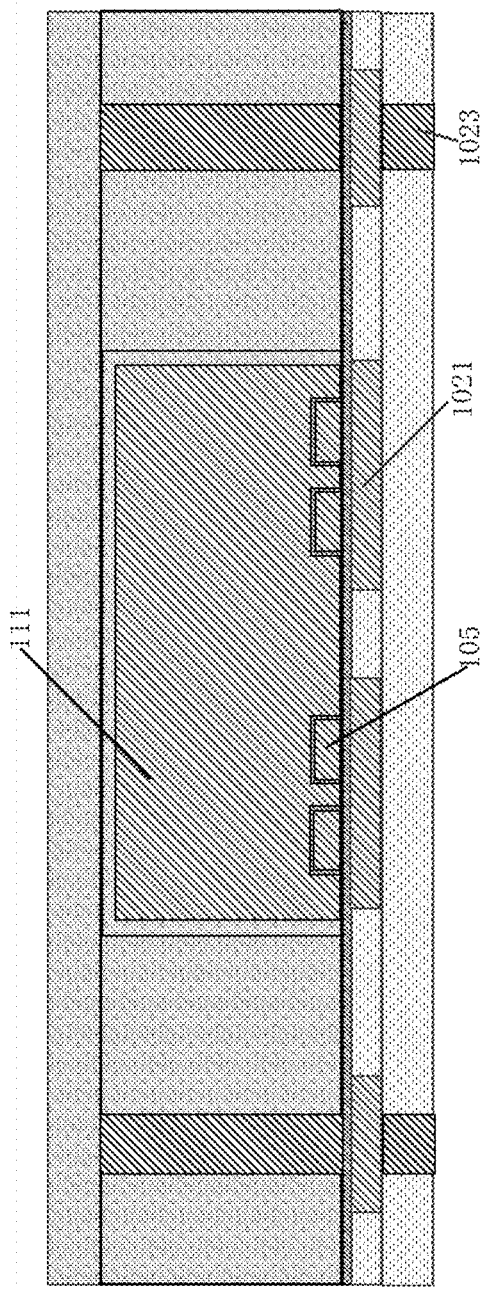

Then, the first circuit layer 1021 is formed on the lower surface 101a of the support frame 101, the electrode 105 is connected with the first circuit layer 1021, and then the conductive column 1023 is prepared on the first circuit layer 1021-step (e), as shown in FIG. 2E. Generally, the following substeps are included:

(e1) sputtering a first metal seed layer on the lower surface 101a of the support frame 101;

(e2) applying a first photoresist layer on the first metal seed layer;

(e3) patterning the first photoresist layer to form a circuit pattern;

(e4) depositing copper in the circuit pattern to form the first circuit layer 1021 such that the electrode 105 is connected with the first circuit layer 1021;

(e5) applying a second photoresist layer on the first circuit layer 1021;

(e6) patterning the second photoresist layer to form a first conductive hole;

(e7) depositing copper in the first conductive hole to form the first conductive column 1023; and (e8) removing the first photoresist layer and the second photoresist layer, and etching away the first metal seed layer.

Generally, the first metal seed layer may be formed on the lower surface 101a of the support frame 101 by sputtering a metal such as copper, titanium, etc. The first photoresist layer and the second photoresist layer may be photosensitive dry films. The first circuit layer 1021 may be formed by depositing copper within the circuit pattern by electroplating metallic copper such that the electrode 105 is connected with the first circuit layer 1021. The terminal of the optical communication device may be connected with the first circuit layer 1021 through the electrode 105 and fanned out through the via column 1011. The first conductive hole can be formed in the second photoresist layer in a mechanical trepanning mode, a photoetching trepanning mode or a laser trepanning mode; the first conductive column 1023, which may be a solid copper column or hollow copper column plated with copper at the edges, is then formed by depositing copper in the first conductive hole by electroplating metallic copper.

Figure 2F:
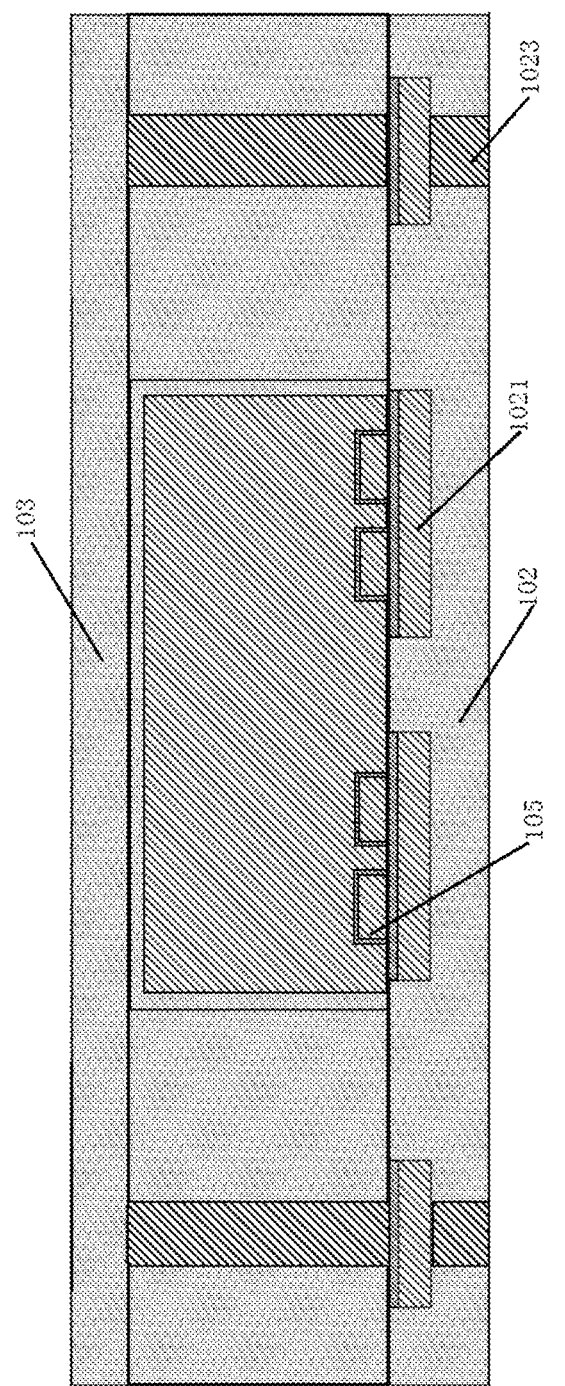

Next, the first dielectric layer 102 is laminated on the first circuit layer 1021 and the first conductive column 1023-step (f), as shown in FIG. 2F. The first dielectric layer 102 may then be thinned and flattened by nog plate or plasma etching to expose the end of the first conductive column 1023. Generally, the first dielectric layer 102 comprises a thermosetting dielectric material, preferably a thermosetting dielectric material containing glass fiber as the reinforcing material, to form a strong first dielectric layer 102, thereby ensuring the strength of the cavity substrate 100.

Figure 2G:
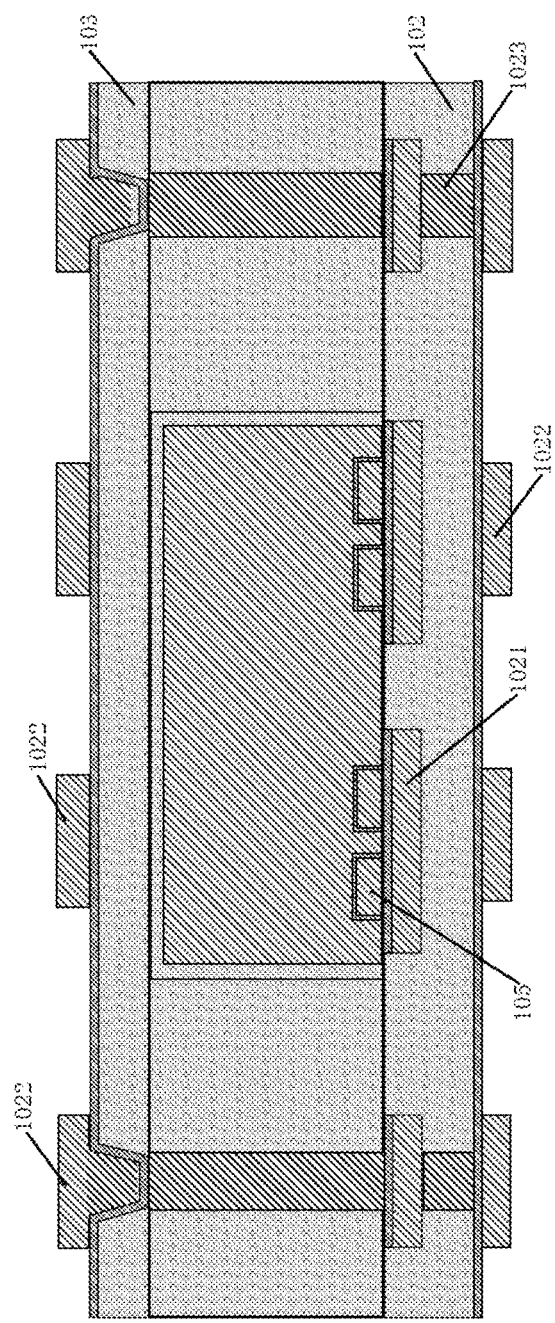

Then, the second circuit layer 1022 is formed on the outer surfaces of the first dielectric layer 102 and the second dielectric layer 103-step (g), as shown in FIG. 2G. Generally, the following substeps are included:

carrying out trepanning in the second dielectric layer 103 to form a second conductive hole;

sputtering a second metal seed layer on the first dielectric layer 102 and the second dielectric layer 103;

electroplating copper on the second metal seed layer to form a copper layer;

applying a third photoresist layer on the copper layer;

patterning the third photoresist layer to form a circuit pattern;

etching the copper layer and the second metal seed layer to form the second circuit layer 1022; and removing the third photoresist layer.

Generally, the second conductive hole may be formed in the second dielectric layer 103 by means of a mechanical trepanning, a photolithographic trepanning or a laser trepanning, and the second metal seed layer may be formed by sputtering metals such as copper, titanium, etc. The first circuit layer 1021 and the second circuit layer 1022 are communicated through the via column 1011.

Figure 2H:
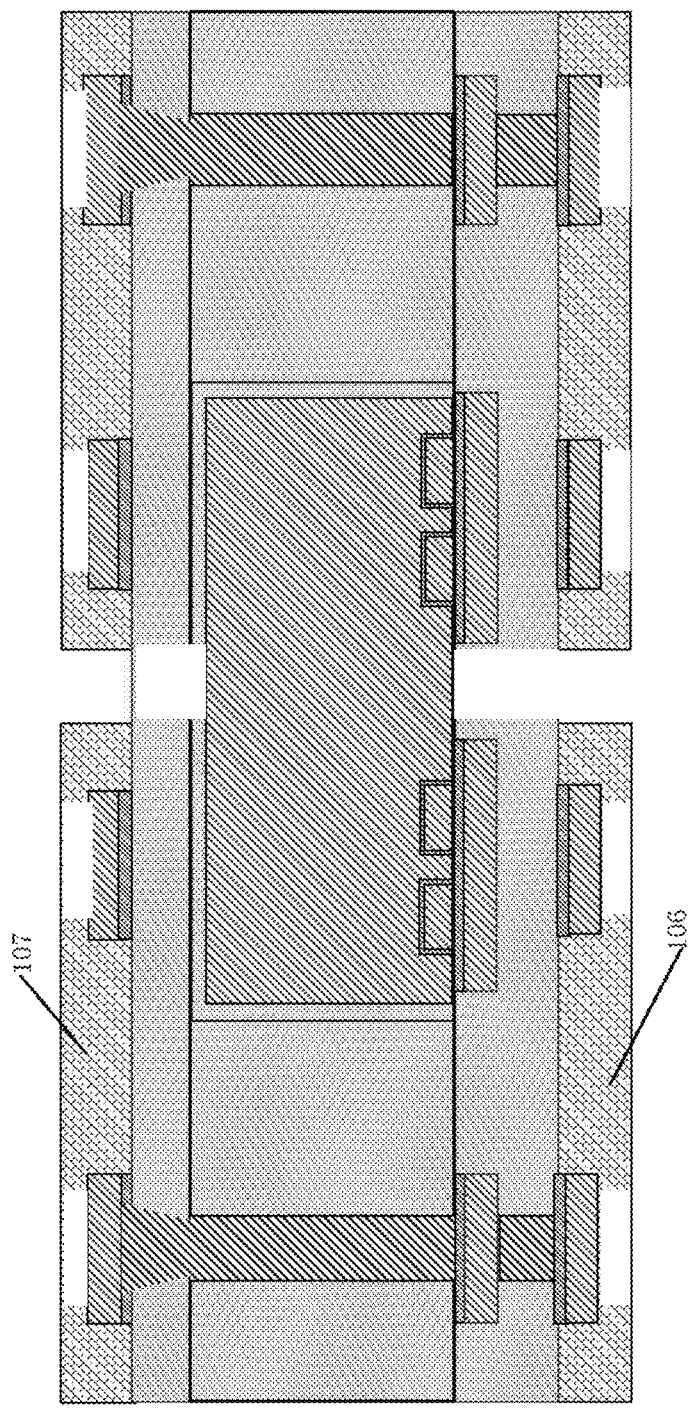

Then, the first solder resist layer 106 and the second solder resist layer 107 are formed on the second circuit layer 1022 on the upper surface and lower surface of the substrate 100, respectively-step (h), as shown in FIG. 2H. After forming the first solder resist layer 106 and the second solder resist layer 107, a bonding pad is formed on the exposed metal surface of the second circuit layer 1022, and the bonding pad may be subjected to a metal surface treatment such as the application of green oil or the like.

Figure 2I:
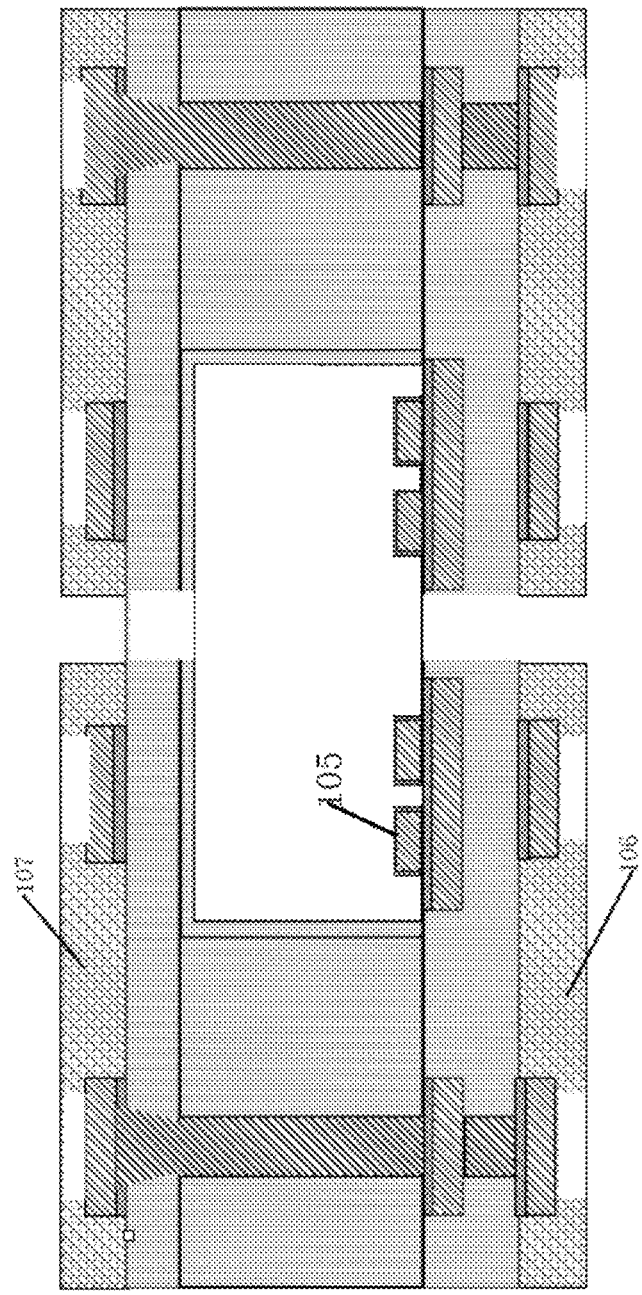

Then, the dielectric in the cavity 104 is removed to expose the active metal block 111; the active metal block 111 and the etch-resistant metal coating the electrode 105 are etched-step (i), as shown in FIG. 2I. Generally, the dielectric within the cavity 104 may be ablatively removed by a laser process to expose the active metal block 111. The corrosive liquid may be introduced into the cavity 104 through an opening formed by a laser process to corrode the active metal block 111, and then a specific etching liquid is introduced to remove the etch-resistant metal coating the electrode 105, thereby exposing the electrode 105.

Figure 2J:
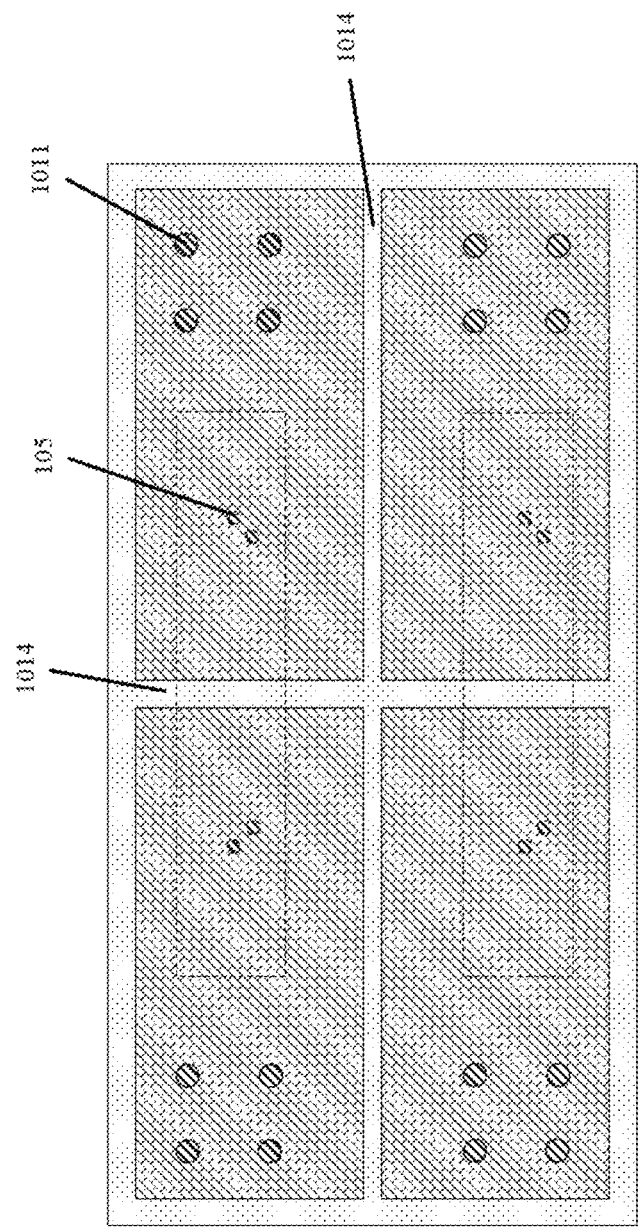

Finally, the cutting is performed along the cutting line 1013 of the cavity 104 to obtain a cavity substrate 100 unit having a directional optoelectronic transmission channel-step (j), as shown in FIG. 2J. The cutting may be performed along the cutting line 1013 using a rotating saw web or other cutting technique such as a laser, resulting in the cavity substrate unit 100.

Figure 2K:
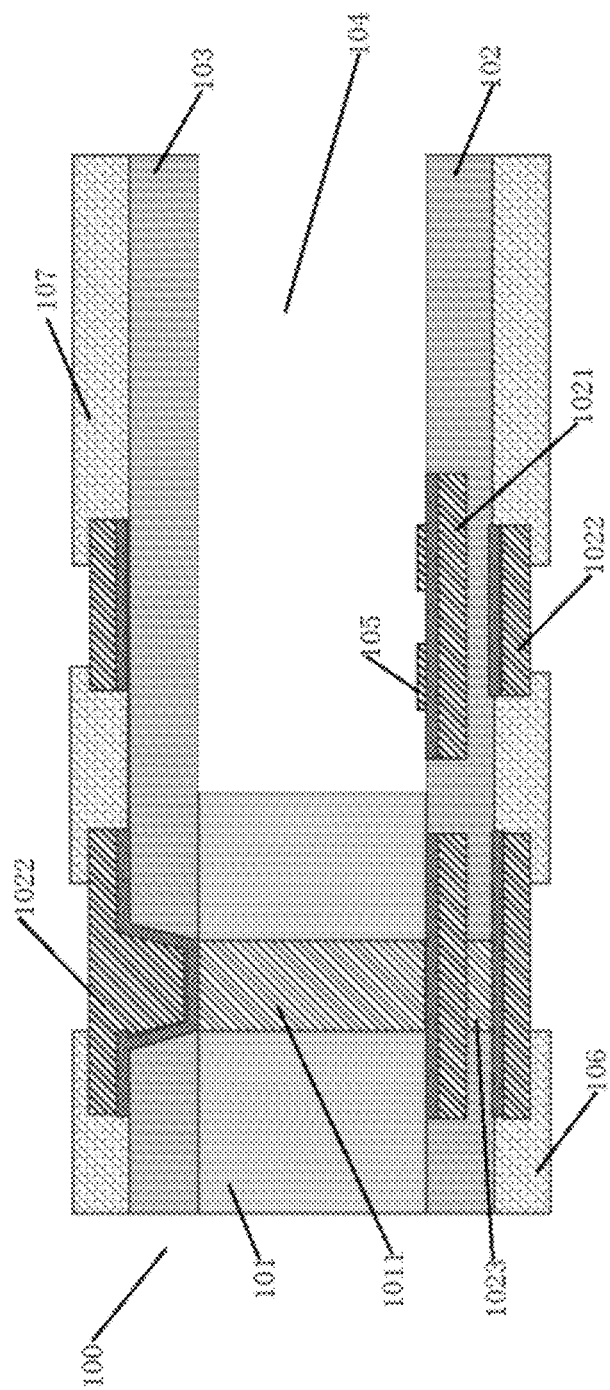

FIG. 2K shows one cavity substrate unit 100 obtained after cutting.

In a practical application of the cavity substrate unit 100, an optical communication device may be installed in the cavity 104 such that the terminal of the optical communication device is connected with the electrode 105 and is fanned out to be connected with the second circuit layer 1022 through the first circuit layer 1021 and the via column 1011 and the first conductive column 1023. The surface mounting of the optical communication device may also be performed on the second circuit layer 1022 such that the cavity substrate 100 has an optical communication device with different optical path directions. An optical-path-coupled light emitting and light receiving circuit can be formed by combining a plurality of cavity substrates 100 on which an optical communication devices is installed. Therefore, since the optical communication device does not need to be completely surface-mounted, the volume of the packaging body can be remarkably reduced, the light receiving device and the light emitting device are thus separately arranged, and respective optical paths are respectively in the length direction and the thickness direction of the substrate such that the interference of optical signal can be avoided, and noise point of the signal can be reduced; therefore, a metal blocking wall does not need to be added, the process steps can be reduced, and the manufacturing cost can be reduced.

Those skilled in the art will recognize that the invention is not limited to what has been particularly shown and described hereinabove and hereinafter. Furthermore, the scope of the invention is defined by the appended claims, including combinations and sub-combinations of the various technical features described hereinabove, as well as variations and modifications thereof, which would occur to persons skilled in the art upon reading the foregoing description.

In the claims, the term "comprising" and variations thereof such as "comprises", "comprise", and the like, mean that the recited assembly is included, but generally other assemblies are not excluded.

What is claimed is:

1. A method for manufacturing a cavity substrate having a directional optoelectronic transmission channel, the method comprising:
   (a) preparing a support frame, wherein the support frame comprises an insulating layer, a via column penetrating through the insulating layer in a thickness direction, and a cavity surrounded by the insulating layer;
   (b) applying an adhesive layer on a first surface of the support frame, and mounting an active metal block on the adhesive layer exposed in the cavity, wherein the active metal block comprises an electrode coated with etching-resistant metal at a bottom of the active metal block;
   (c) laminating a second dielectric layer on a second surface of the support frame to fill a gap of the cavity;
   (d) removing the adhesive layer;
   (e) forming a first circuit layer on the first surface of the support frame, and connecting the electrode to the first circuit layer;
   (f) laminating a first dielectric layer on the first circuit layer;
   (g) forming a second circuit layer on outer surfaces of the first dielectric layer and the second dielectric layer;
   (h) removing dielectric in the cavity to expose the active metal block;
   (i) etching the active metal block and an etching-resistant metal coating the electrode; and
   (j) cutting along a scribe line of the support frame to obtain the cavity substrate having a directional optoelectronic transmission channel.

2. The manufacturing method for a cavity substrate having a directional optoelectronic transmission channel according to claim 1, wherein the adhesive layer in step (b) comprises a tape.

3. The manufacturing method for a cavity substrate having a directional optoelectronic transmission channel according to claim 1, wherein the active metal block in step (b) is a copper block or an aluminum block.

4. The manufacturing method for a cavity substrate having a directional optoelectronic transmission channel according to claim 1, wherein the etching-resistant metal coated on the electrode is selected from at least one of nickel or titanium.

5. The manufacturing method for a cavity substrate having a directional optoelectronic transmission channel according to claim 1, wherein the first dielectric layer and the second dielectric layer comprise a thermosetting dielectric material.

6. The manufacturing method for a cavity substrate having a directional optoelectronic transmission channel according to claim 5, wherein the first dielectric layer and the second dielectric layer comprise a thermosetting dielectric material containing glass fiber as a reinforcing material.

7. The manufacturing method for a cavity substrate having a directional optoelectronic transmission channel according to claim 1, wherein step (e) comprises the following substeps:
   (e1) sputtering a first metal seed layer on the first surface of the support frame;
   (e2) applying an adhesive first photoresist layer on the surface of the first metal seed layer;
   (e3) patterning the first photoresist layer to form a circuit pattern;
   (e4) depositing copper in the circuit pattern to form the first circuit layer such that the electrode is connected with the first circuit layer;
   (e5) applying a second photoresist layer on the first circuit layer;
   (e6) patterning the second photoresist layer to form a first conductive hole;
   (e7) depositing copper in the first conductive hole to form a first conductive column; and
   (e8) removing the first photoresist layer and the second photoresist layer, and etching away the first metal seed layer.

8. The manufacturing method for a cavity substrate having a directional optoelectronic transmission channel according to claim 7, wherein the copper is deposited by electroplating.

9. The manufacturing method for a cavity substrate having a directional optoelectronic transmission channel according to claim 1, wherein step (f) comprises laminating the first dielectric layer on the first circuit layer and the first conductive column, and thinning and flattening the first dielectric layer by means of nog plate or plasma etching to expose the end of the first conductive column.

10. The manufacturing method for a cavity substrate having a directional optoelectronic transmission channel according to claim 1, wherein step (g) comprises the following substeps:
   forming a second conductive hole in the second dielectric layer;
   sputtering a second metal seed layer on the first dielectric layer and the second dielectric layer;
   electroplating copper on the second metal seed layer to form a copper layer;
   applying a third photoresist layer on the copper layer;
   patterning the third photoresist layer to form a circuit pattern;
   etching the copper layer and the second metal seed layer to form the second circuit layer; and
   removing the third photoresist layer.

11. The manufacturing method for a cavity substrate having a directional optoelectronic transmission channel according to claim 1, wherein step (h) comprises opening the cavity by a laser process and removing the dielectric in the cavity to expose the active metal block.

12. The manufacturing method for a cavity substrate having a directional optoelectronic transmission channel according to claim 11, wherein step (i) comprises introducing an etching liquid into the cavity through an opening opened by a laser to etch the active metal block and the etching-resistant metal coating the electrode.

13. The manufacturing method for a cavity substrate having a directional optoelectronic transmission channel according to claim 1, wherein the scribe line comprises a centerline of the cavity such that a cavity opening is formed in a side edge of the substrate after cutting.

* * * * *